United States Patent
Gates et al.

(10) Patent No.: US 6,180,444 B1
(45) Date of Patent: *Jan. 30, 2001

(54) SEMICONDUCTOR DEVICE HAVING ULTRA-SHARP P-N JUNCTION AND METHOD OF MANUFACTURING THE SAME

(75) Inventors: Stephen McConnell Gates, Ossining, NY (US); Roy Edwin Scheuerlein, Cupertino, CA (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/025,710

(22) Filed: Feb. 18, 1998

(51) Int. Cl.[7] .............................................. H01L 21/8234
(52) U.S. Cl. .......................... 438/237; 438/328; 438/486; 438/487
(58) Field of Search ..................................... 438/398, 486, 438/487, 522, 660, 160, 39, 91, 237, 328; 148/DIG. 1; 257/623, 588

(56) References Cited

U.S. PATENT DOCUMENTS

| | | | |
|---|---|---|---|
| 4,653,858 | * | 3/1987 | Szydlo et al. ........................ 438/482 |
| 4,680,085 | * | 7/1987 | Vijan et al. ........................... 438/482 |
| 4,732,873 | * | 3/1988 | Perbet et al. .......................... 438/27 |
| 4,810,637 | * | 3/1989 | Szydlo et al. ..................... 148/DIG. 1 |
| 5,008,590 | * | 4/1991 | Huisman et al. ..................... 257/458 |
| 5,151,255 | * | 9/1992 | Fukuda et al. .................. 148/DIG. 1 |
| 5,336,641 | * | 8/1994 | Fair et al. ............................ 438/486 |
| 5,405,786 | * | 4/1995 | Kurtz ..................................... 438/53 |
| 5,424,230 | * | 6/1995 | Wakai ............................ 148/DIG. 1 |
| 5,529,937 | * | 6/1996 | Zhang et al. .................... 148/DIG. 1 |
| 5,639,689 | * | 6/1997 | Woo ..................................... 438/398 |
| 5,640,343 | * | 6/1997 | Gallagher et al. ................... 365/171 |
| 5,648,662 | * | 7/1997 | Zhang et al. ........................... 257/59 |
| 5,681,759 | * | 10/1997 | Zhang ................................. 438/162 |

OTHER PUBLICATIONS

Hong "Characterization of Ultra–Shallow P+–N Junction Diodes Fabricated by 500–Ev Boron–Ion Implantation", IEEE, pp. 28–31, Jan. 1991.*

Wu et al. "Characteristics of Polysilicon Contacted Shallow Junction Diode Formed with a Stacked–Amorphous–Silicon Film", IEEE, pp. 1797–1804, Oct. 1993.*

Wu et al. "High–Performance Polysilicon Contacted Shallow Junctions Formed by Stacked–Amorphous–silicon Films", IEEE, pp. 23–25, Jan. 1991.*

* cited by examiner

*Primary Examiner*—Carl Whitehead, Jr.
*Assistant Examiner*—Maria Guerrero
(74) *Attorney, Agent, or Firm*—McGuireWoods LLP; Manny W. Schecter

(57) ABSTRACT

A semiconductor device such as a P-N or P-I-N junction diode, includes a first semiconductor layer having a first conductivity-type and being mounted over a metal address line, and a second semiconductor layer having a second conductivity-type and being mounted over the first semiconductor material. The diode preferably has a thickness of substantially no more than about 1 micron, and the diode includes a P-N junction confined to a thickness of less than about 0.1 micron. In the preferred embodiment the method comprises depositing a first semiconductor layer having a first conductivity type, depositing a second intrinsic layer, annealing to convert both layers to a polycrystalline layer, implanting ions of a second conductivity type into the second layer, and annealing to convert the second layer to a polycrystalline. The result is a diode having an ultra-sharp p-n junction.

12 Claims, 5 Drawing Sheets

SEMICONDUCTOR DEVICE HAVING ULTRA-SHARP P-N JUNCTION AND METHOD OF MANUFACTURING THE SAME

BACKGROUND OF THE INVENTION

1. Field of the Invention

The present invention generally relates to a semiconductor device and methods of making the semiconductor device and, more particularly, to a thin P-N diode containing an ultra-sharp P-N junction.

2. Description of the Related Art

A conventional crosspoint magnetic tunnel junction magneto-resistive memory cell such as a nonvolatile magnetic random access memory (MRAM), as disclosed for example, in U.S. Pat. No. 5,640,343, commonly assigned with the present application and incorporated herein by reference, requires a diode in series with each magnetic tunnel junction (MTJ) memory element.

With this arrangement, a sense current flows through only one memory element instead of through N elements (where N is an integer greater than 1), as in conventional series architecture magneto-resistive memories. As a result, the signal-to-noise ratio is increased by a factor of N at the same sense power, or alternatively the sense power is decreased by N squared at equal signal-to-noise ratio. Moreover, high density very-large-scale-integrated (VLSI) magneto-resistive memory designs become possible.

However, the areal density of the crosspoint magnetic tunnel junction magneto-resistive memory cells can be increased if the diode is located on top of a metal conductor, as shown in FIGS. 1B, 1C, and 9 of U.S. Pat. No. 5,640,343. The write current, which flows through this lower conductor is on the order of milli-Amperes, and should be close to the magnetic tunnel junction for good efficiency in generating the required magnetic field at the magnetic tunnel junction.

A diode on top of a conductor can be formed by crystalizing a deposited amorphous silicon layer. Such crystalized material has been used for silicon solar cells, but the conductivity of those diodes is lower than required for the crosspoint magnetic tunnel junction magneto-resistive memory cell. Further, since the sensing operation is a resistance measurement, any series resistance or low conductivity switch in series with the sense current path will detract from the signal being sensed. This is a problem.

Additionally, with the conventional structures, it has not been possible to simultaneously provide a high conductivity diode built on top of a metal conductor, and to minimize the contact resistance in series with the diode. Specifically, tradeoffs have been required since to optimize both objects requires thin and highly-doped silicon regions for very steep junctions which conflicts with the conventional processing of crystalized silicon (e.g., "polysilicon").

SUMMARY OF THE INVENTION

In view of the foregoing and other problems of the conventional structures, an object of the present invention is to produce a high conductivity diode on top of a metal conductor, and to minimize the contact resistance in series with the diode.

Another object of the present invention is to produce grain sizes in the thin film polycrystalline silicon as large as the size of the diode used in deep submicron VLSI magneto-resistive memories.

In view of the foregoing, the present invention is directed to providing a thin P-N diode containing an ultra-sharp P-N junction, and methods of forming the ultra-sharp P-N junction.

In a first aspect of the present invention, the present invention provides a thin P-N diode, (e.g., preferably 0.1–1.0 microns thick), made in a thin film Si. The diode preferably includes a mesa (island) of polycrystalline Si located on (and contacting) a metal thin film wire, with a P-N junction preferably confined to a Si thickness of 0.01–0.1 microns.

In yet another aspect of the present invention, a method of manufacturing the confined P-N junction, with ultra-sharp profiles of both P and N dopants, is provided.

The diode of the present invention is distinguished by the following physical characteristics:

1. The diode is located on top of a metal address line (thin film wire), and has a low resistance electrical contact to the metal line;
2. The diode is formed in a "mesa" or island of semiconducting material, and the mesa or island has a thickness less than 1.0 micron;
3. The P-N junction is formed within a thin region of a semiconducting material, about 0.05 to 0.3 micron in thickness; and
4. The diode area is determined by the intersecting area of two (2), approximately perpendicular, metal lines, and is approximately equal to the square of the width of the metal lines (assuming the lines are equal in width). According to this method of defining the device area, a wide range of areas can be easily fabricated, including areas less than 1 micron$^2$.

The diode of the present invention is unique among thin film diodes in that the following characteristics specify the electrical performance of the diode:

1. Very low resistance at each of the top and bottom contacts, less than about 100,000 Ohms, and preferably less than 25,000 Ohms at each contact;
2. A low differential resistance of the complete diode measured at 0.5 to 1 Volt, less than 50,000 Ohms and preferably less than 20,000 Ohms;
3. Forward current density, $J_F$ of more than 1 microAmpere per micro-meter$^2$, at +1 Volt; and
4. Reverse current density, $J_R$ of less than 10 picoAmpere per micro-meter$^2$, at −1 Volt.

The present invention also includes process methods to fabricate a diode having the above characteristics.

An advantage of the method of the present invention is that cost of fabrication is reduced when either one or two slow and costly dopant implantation steps can be eliminated in favor of the use of either one or two in situ -doped Si layers, as in the processes of the present invention.

Further, an atomically smooth top surface on the finished polycrystalline Si (Poly—Si) mesa structure is easily obtained by using amorphous Si (a—Si) layers. The atomically smooth surface is required for subsequent formation of the magnetic tunnel junction layer, so a planarization step on the finished diode is eliminated.

Additionally, the amorphous Si (a—Si) layers can be grown conformally over 3-dimensional structures. Thus, the P-N diode can be located on the sidewall of a metal addressing line (or on the sidewall of a trench). This enables high areal density arrays of diodes to be easily made.

Further, the methods of the present invention utilize standard processing tools that are found in most semiconductor device factories, so that inexpensive manufacturing of the present invention is possible.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1A:
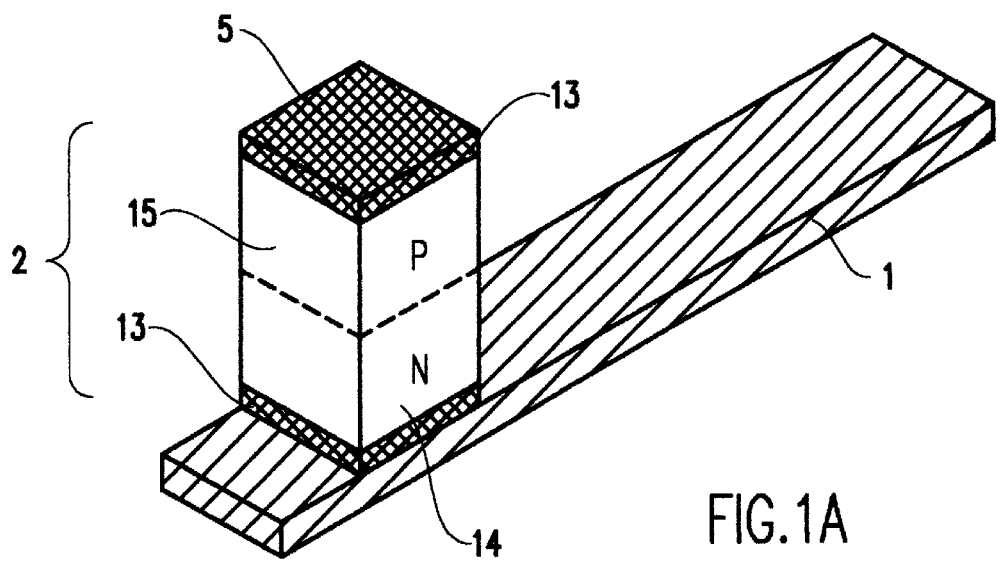
FIG. 1A illustrates a completed semiconductor device 2 (e.g., diode) according to the present invention on a metal addressing line 1.
Figure 1B:
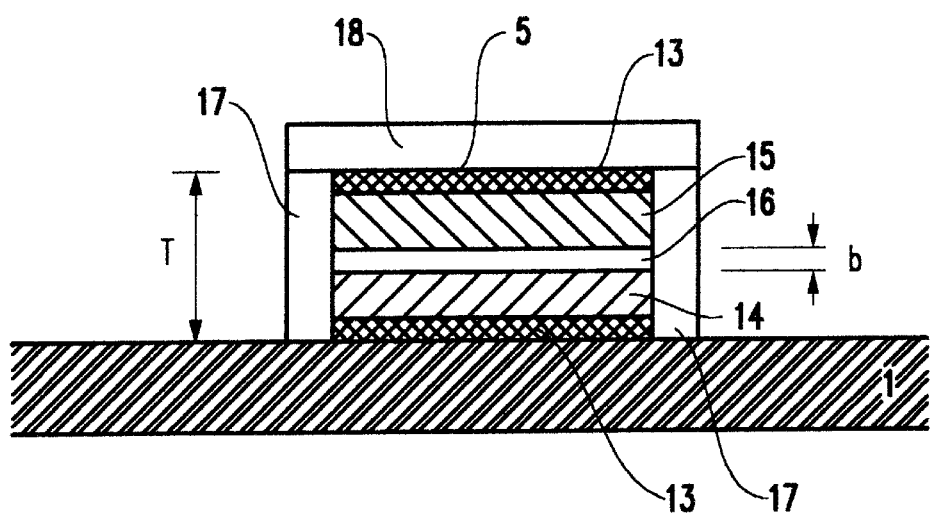
FIG. 1B illustrates a cross-sectional view of the completed semiconductor device (e.g., diode) 2 according to the present invention shown in FIG. 1A.

Referring now to the drawings, and more particularly to FIGS. 1A–1B, there is shown a completed semiconductor device according to the present invention.

The present invention generally includes a diode comprising a semiconductor layer of a first conductivity-type adjacent to a semiconductor layer of a second conductivity-type.

Moreover, the present invention generally is beneficial as a component of the crosspoint magnetic tunnel junction magneto-resistive memory cell, which is described in detail in U.S. Pat. No. 5,640,343, incorporated herein by reference. Of course, as would be further known by the ordinarily skilled artisan, other structures also would benefit by the present invention.

Referring now to FIGS. 1A–1B, the semiconductor device (e.g., diode) structure of the present invention is now described.

FIG. 1A shows a completed diode 2 located on a metal address line 1. The diode 2 includes an N-type thin film semiconductor layer 14 positioned on the metal addressing line 1, and a P-type semiconductor layer 15 positioned over and in contact with the N-type layer 14. Metal addressing line 1 preferably comprises aluminum, copper, tungsten and alloys such as AlCu, TiW, or other metals.

The lower metal address line 1, preferably made from tungsten, is approximately square in cross-section, its width and height both being 1 micron or less. The tungsten has a resistance of about 0.12 Ohms per micron of length for a width of one micron. When made from aluminum or copper, lower resistance is obtained. The voltage drop along the line when passing currents used to magnetically write the magneto-resistive element (e.g., the MTJ) is minimized by the square cross-section.

Each memory cell includes a diode and an MTJ, stacked vertically in a mesa with a square or rectangular outline in plan view. For example, the cell edge would be 2 microns or less. Using the maximum of 2 microns, and a square outline, the metal line resistance per cell would be 0.24 Ohms per cell. Then, writing currents of about 10 mA in an array of cells with 128 cells along this line would have a voltage drop of about 300 mV, and would not be excessive.

Thus, as mentioned above, the present invention generally includes a diode including a semiconductor layer 14 of a first conductivity-type adjacent to a semiconductor layer 15 of a second conductivity-type. It is noted that, while a specified layer arrangement is shown in FIGS. 1A–1B (as well as FIGS. 2–4), a diode with P-type layer below and N-type layer above is also included in this invention, although not shown in FIGS. 1A–1B.

Referring now to FIG. 1B, between the diode 2 and the address line 1 is a contact layer 13. Specifically, the contact layer 13 is deposited on the metal line 1. A similar contact layer 13 is located between the diode 2 and a metal layer 18 shown in FIG. 1B. Contact layers 13 each preferably comprise very highly doped semiconductor layers containing from $10^{19}$ to $10^{21}$ dopant atoms $cm^{-3}$ and metal silicide. Preferred silicides include the silicides of platinum, titanium, cobalt, and tungsten, and preferably have a thickness within a range of 0.01 to 0.06 microns, and more preferably approximately 0.02 microns.

Optionally, the contact layer 13 may comprise two sublayers including a highly doped layer and a silicide layer. Alternately, a first sublayer contacting the metal line 1 may be a diffusion barrier (e.g., TiN or SiTaN), and the second sublayer contacting the semiconductor layer 14 may be a very highly doped semiconductor.

The metal layer 18 is the initial layer in deposition of the MTJ element, as described in U.S. Pat. No. 5,640,343. Metal layer 18 preferably comprises tantalum, aluminum, platinum, palladium, titanium, and/or alloys of the foregoing, and preferably has a thickness within a range of 0.005 to 0.05 microns, and more preferably 0.01 to 0.02 microns. It is noted that the metal layer is not a part of the present invention but represents an important component of the MTJ and the structure shown in U.S. Pat. No. 5,640,343.

As shown in FIG. 1B, the P-N diode has an overall thickness T, and includes the N-type semiconductor layer 14 and the P-type semiconductor layer 15, with a P-N junction 16 having thickness D. Preferably, thickness T is within a range of 0.1 to 1 micron, and more preferably 0.2 to 0.5 micron. Additionally, thickness D preferably is within a range of 0.005 to 0.5 micron, and more preferably 0.01 to 0.1 micron.

As such, the diode of the present invention is a "mesa" structure. Since the diode is a mesa structure, an insulator layer 17, which is preferably $SiO_2$, is required to prevent current leakage on the exterior sidewalls of the diode. It is noted that the diode thickness is substantially the same as the height of the insulator layer 17. Optionally, layer 17 can fill all of the space between diodes in an array of diodes.

Preferably, the completed diode has a smooth top surface 5, which is important for construction of the MTJ, and must be present before deposition of the metal layer 18. For example, when fabricated by the methods of the present invention, the root mean square (rms) roughness of the surface 5 can be approximately 0.005 to 0.02 microns. It is noted that surface 5 is the same as the top surface of upper contact layer 13. Further, it is noted that metal layer 18 is an optional portion of the inventive structure.

Routinely, P-N junctions are formed in a semiconductor film, and are characterized by a plot of dopant concentration versus depth from the top surface of the film. This plot is called a "dopant profile", and is typically measured by Secondary Ion Mass Spectrometry (SIMS).

As one example, when the dopant concentration changes by three (3) orders of magnitude within a depth of, for example, about 0.1 micron, the profile is "abrupt", or "sharp". When the dopant concentration changes by 2–4 orders of magnitude over a larger depth range of 0.2 micron or more, the profile is considered "gradual". Obviously, the numbers above are exemplary and the terms "abrupt" and "gradual" are relative.

Also routinely, P-N junctions are formed by ion implantation of the P and N dopants, requiring a separate implantation step for each dopant. Typically, ion-implanted junctions are distributed over a Si thickness (depth) of 0.01–0.2 micron, or more, due to statistical variation in the ion implantation depth, and dopant diffusion during the dopant activation anneal of several seconds to thousands of seconds.

When used as a selection device for an array of Magnetic Tunnel Junction (MTJ) memory elements, the diode must be relatively thin.

Specifically, the diode thickness is preferably 0.1–1.0 micron. When used for selection in an MTJ array, the diode must exhibit the following physical characteristics:

1. The diode is located on top of a metal address line (thin film wire), and has a low resistance electrical contact to the metal line;
2. The diode is formed in a "mesa" or island of semiconducting material, and the mesa or island has a thickness less than 1.0 micron;
3. The P-N junction is formed within a thin region of a semiconducting material, about 0.01 to 0.1 micron in thickness; and
4. The diode area is determined by the intersecting area of two (2), approximately perpendicular, metal lines, and is approximately equal to the square of the width of the metal lines (assuming the lines are equal in width). Hence, the diode according to this method can be fabricated easily to have a wide range of areas, including areas less than 1 micron$^2$.

Further, when used for selection in an MTJ array, the diode must exhibit the following electrical characteristics:

1. Very low resistance at each of the top and bottom contacts, less than about 100,000 Ohm, and preferably less than 25,000 Ohms at each contact;
2. A low differential resistance of the complete diode measured at 0.5 to 1 Volt, less than 50,000 Ohms and preferably less than 20,000 Ohms;
3. Forward current density, $J_F$, of more than 1 microAmpere, at +1 Volt per micrometer$^2$; and
4. Reverse current density, $J_R$ of less than 10 picoampere, per micrometer$^2$ at −1 Volt.

The ultra-sharp P-N junction diodes of the present invention meet the above requirements.

Referring to the above electrical specifications, $J_F$. depends strongly on the Poly-Si grain size, while $J_R$ depends strongly on the structure of the grain boundaries between the grains. For any of the annealing steps of the present invention, the preferred process is excimer laser annealing (ELA) because both the grain size and the grain boundary structure produced by the ELA method are favorable to $J_F$ and $J_R$.

In common practice and in the conventional methods, the ELA process has been used to convert an a—Si layer to a Poly—Si layer with the constraint that the Si layer is located on top of an insulator layer, preferably SiO$_2$. The insulator layer has a low thermal conductivity and then serves to confine the heat of the laser pulse, and hence the laser energy required to melt the Si layer is decreased. For example, energy densities of 0.2–0.8 J/cm$^2$ are used to laser anneal an a—Si layer 0.1 microns thick (e.g., see for example, "Crystallization Process of Polycrystalline Silicon by KrF Excimer Laser Annealing", Watanabe et al., Jpn. J. Appl. Phys. Vol. 33, Part 1, No. 8, pp. 4491–4498 (1994)).

Referring to FIG. 1B, in the present invention an a—Si layer located on top of a metal line 1 is converted to Poly—Si by ELA. The metal line has a high thermal conductivity, and thus melting of the a—Si is difficult. Accordingly, preferably the metal line 1 is located on top of an insulator layer (not illustrated in FIG. 1A) such as SiO$_2$, the SiO$_2$ layer serving to confine the heat of the laser pulse.

Preferably, the metal line 1 is as thin as possible. Further, the a—Si layer 14, 15 is preferably very thin, less than 0.3 microns thick and preferably 0.1–0.2 microns thick. To prevent reaction of the Si layer with the metal line 1, the contact layer ideally comprises a conducting diffusion barrier material such as TiN or SiTaN.

The preferred laser energy density is 0.6–1.0 J/cm$^2$, and the preferred sample temperature during ELA is 400–800° C. (although lower temperatures including room temperature may be used).

Referring to FIG. 1B, it is preferred that the insulator layer 17 is present and completely surrounds and encapsulates the Si mesas during the ELA process. The layer 17 is preferably SiO$_2$ and serves to prevent flowing of the liquid Si during ELA, and hence serves to maintain the desired Si mesa shape. It is necessary to perform the ELA process before the metal layer 18 is present, and then to deposit the metal layer 18 after the ELA process step.

Alternatively, rapid thermal annealing (RTA) is a viable method for performing the annealing steps of the present invention.

Preferred conditions for the RTA steps of the invention are heating the sample to a temperature of 600–900° C. for a time of 5 to 1,000 seconds.

RTA is not as preferable as ELA in the inventive process because the Poly—Si grain size formed by RTA is small (0.05–0.1 microns) and a wide distribution of grain sizes is obtained. Additionally, the grain boundaries of the Poly-Si formed by RTA are highly conductive. In contrast, the Poly-Si grain size formed by ELA is large (0.1–2 microns) and a narrow distribution of grain sizes is obtained. Additionally, the grain boundaries of ELA Poly-Si are less conductive (as compared to RTA Poly—Si).

Figure 2:
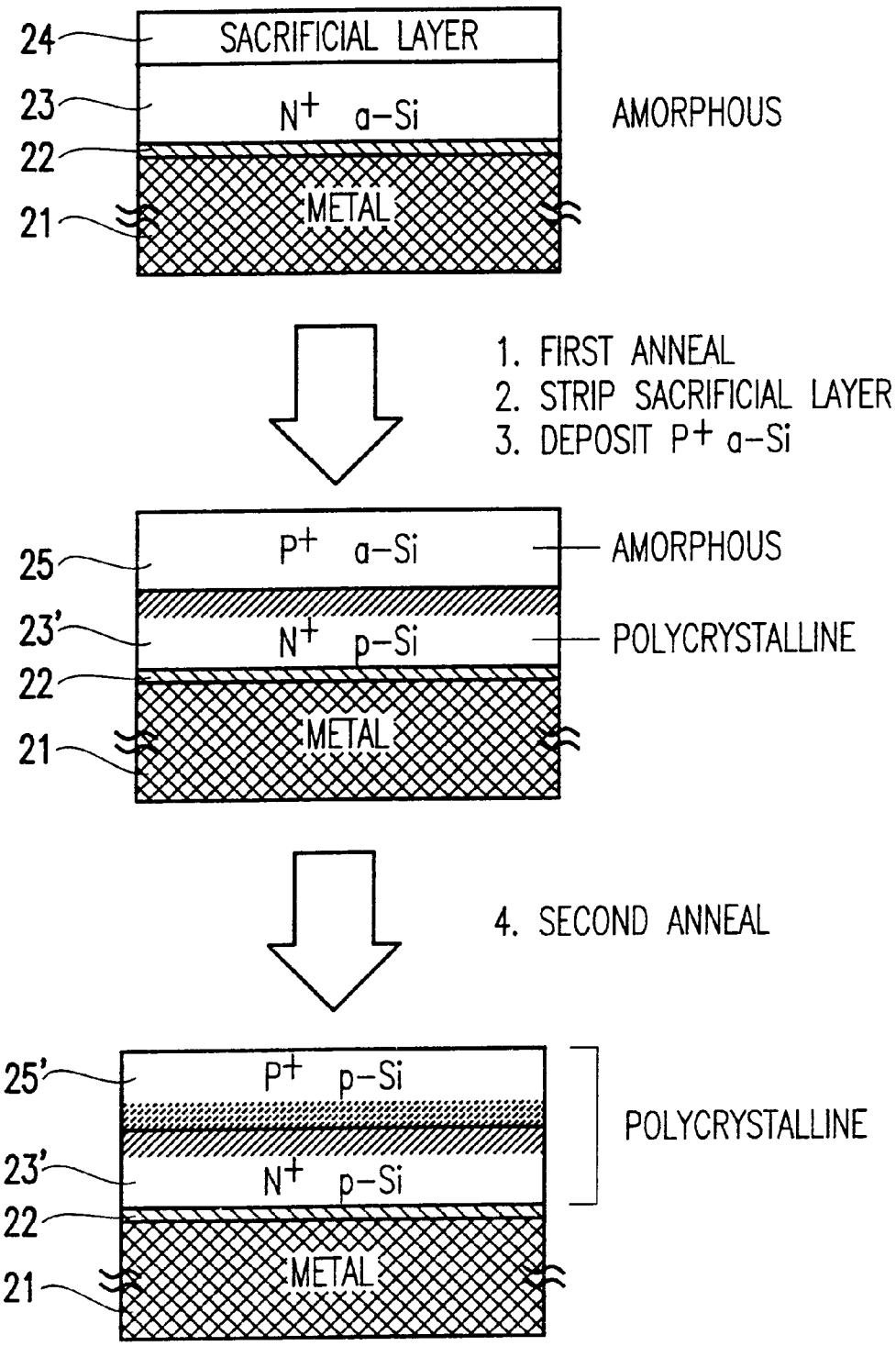
FIG. 2 illustrates process steps of forming the semiconductor device (e.g., diode) according to a first embodiment of the method of the present invention.

Referring to FIG. 2, a first embodiment of the method of the present invention for making the confined P-N junction is now described. In FIG. 2, both the N and P dopants are placed in situ during a-Si deposition, but there are two separate deposition steps. The stepwise formation method is described below.

First, contact layer 22 is formed on a metal layer 21 (which is equivalent to metal line 1 in FIGS. 1A–1B). Then, a layer 23 of N$_+$ a—Si (e.g., the first layer) is deposited on the contact layer 22 (e.g., layer 22 is equivalent to lower layer 13 in FIG. 1B). The contact layer 22 preferably has a thickness in the range of 0.005 to 0.05 and more preferably 0.01 to 0.03 microns.

Optionally, the contact layer 22 may include first and second sublayers. The first sublayer contacting the metal line 21 is a diffusion barrier (e.g., TiN or SiTaN or Ta), and the second sublayer contacting the semiconductor layer 23 is a very highly doped semiconductor. Layer 23 preferably has a thickness in the range of 0.05 to 0.5 and more preferably 0.1 to 0.2 microns.

Then, a sacrificial layer 24 (for example, amorphous Si Nitride, SiN$_X$, or SiO$_2$) is formed in a single deposition tool or in a cluster tool and deposited over the N$^+$ a—Si layer 23.

Preferably, the sacrificial layer 24 has a thickness in the range of 0.01 to 0.5 microns, and more preferably 0.05 to 0.2 microns.

The first annealing step is performed in either an above-described RTA tool, or in an above-described ELA tool, thereby converting the Si layer 23 to $N^+$ Poly—Si layer 23'. Once again, the ELA tool is preferable over the RTA tool because, as mentioned above, the Poly—Si grain size formed by RTA is small (0.05–0.1 microns) and a wide distribution of grain sizes is obtained. Additionally, the grain boundaries of the Poly-Si formed by RTA are highly conductive. In contrast, the Poly—Si grain size formed by ELA is large (0.1–2 microns) and a narrow distribution of grain sizes is obtained. Additionally, the grain boundaries of ELA Poly—Si are less conductive (as compared to RTA Poly—Si).

In FIG. 2, the short diagonal lines schematically show a crystalline grain structure in the first $N^+$ layer 23' (this layer is polycrystalline at the end of step 1).

Thereafter, in step 2, the sacrificial layer 24 is removed in a hydrofluoric (HF) etch or buffered HF, leaving an atomically clean and smooth surface terminated with H atoms on the $N^+p$—Si layer 23'.

In step 3, the layer 25 of P+ a—Si (the second layer) is deposited on the $N^+$ p—Si layer 23', the $P^+$ a—Si layer 25 preferably having a thickness in the range of 0.05 to 0.5 microns, and more preferably 0.1 to 0.2 microns. Thus, the same thickness applied to both layers 23 and 25.

Optionally, layer 25 can be deposited as intrinsic Si, and an ion implantation step can be added.

In step 4, the second anneal step (by either RTA or ELA as above) is performed, thereby to convert the $P^+$ a—Si layer 25 to $P^+$ p—Si layer 25'. It is noted that it may be beneficial to use ELA for the first anneal and RTA for the second anneal. However, it is further noted that commonly it is best to use the same tool for both steps for manufacturing economies and less complex steps.

The dashed diagonal lines schematically show the "seeding" effect of the crystalline first layer 23'. Solid phase epitaxy occurs in the second anneal step. The first layer is a seed layer for the second layer. The first layer may contain large grains, or is a single large Si grain (following ELA). For purposes of this application "large Si grain" is defined as the grain size being comparable to or larger (e.g., $\geq$) than the diode area.

Optimum diode characteristics are obtained with a Poly—Si grain size equal to or larger than the diode area. Therefore, preferably ELA is used for performing the anneal steps in FIGS. 2–4.

In the second anneal step, the temperature can be lower or the time can be shorter (compared to the First Anneal) because of the seed effect of the first layer.

For example, using the RTA method, the preferred temperature for the second anneal step can be within the range of 600–800° C., as compared to 700–900° C. for the first annealing step. Similarly, the time can be within the range of 5 to 100 seconds, as compared to the first annealing step having a time of 10 to 1,000 seconds. The lower temperature and shorter time enable the ultra-sharp dopant profile to be maintained.

Also, the P-N junction is formed at the well-defined interface between the first and second layers. The result is uniform conduction over the diode area, and from diode to diode, giving reproducible electrical behavior.

The purpose of the sacrificial layer 24 is to provide a very smooth and atomically pure top surface on the Poly—Si layer 23'. Optionally, the sacrificial layer can be eliminated, and the top surface of the first layer can be cleaned immediately prior to deposition of the second layer by HF dipping.

With the first embodiment of the invention, the cost of fabrication is reduced since slow and costly dopant implantation steps can be eliminated by using either one or two in situ -doped Si layers, as in the first embodiment of the present invention.

Further, an atomically smooth top surface on the finished polycrystalline Si (Poly—Si) mesa structure, used for subsequent formation of the magnetic tunnel junction layer or the like, is easily obtained by using amorphous Si (a—Si) layers. Thus, a planarization step on the finished diode is eliminated, thereby saving costly manufacturing steps.

Additionally, the amorphous Si (a—Si) layers can be grown conformally over 3-dimensional structures, so that the P-N diode can be located on the sidewall of a metal addressing line (or on the sidewall of a trench). As a result, high areal density arrays of diodes can be fabricated easily.

Referring to FIGS. 3A–3D, a second embodiment of the method according to the present invention is described hereinbelow.

The second embodiment differs from the first embodiment by using no sacrificial layer, and requiring only one ion implantation step.

Figure 3A:
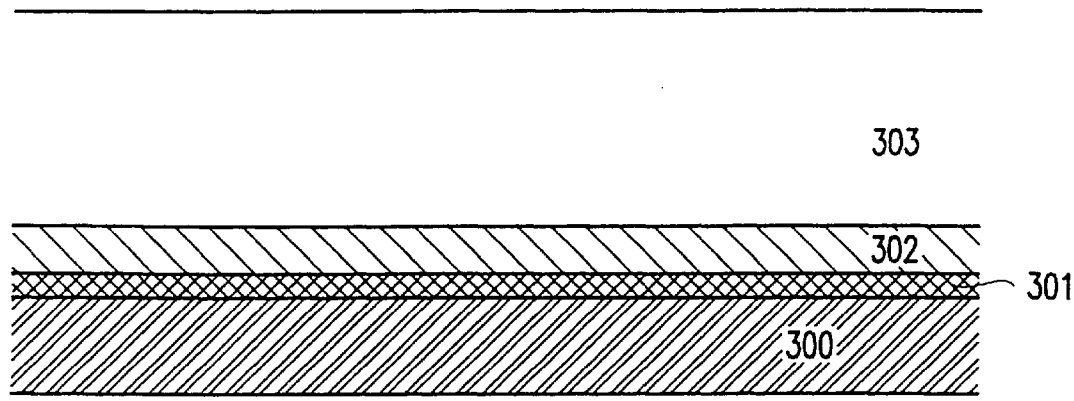
FIGS. 3A–3C illustrate a process for forming a semiconductor device (e.g., diode) according to a second embodiment of the method of the present invention.

In FIG. 3A, the metal address line 300 has been deposited and patterned. Metal line 300 preferably comprises aluminum, copper, tungsten and alloys such as AlCu, TiW, or other metals.

Optionally, a diffusion barrier layer 301 is placed on top of the metal line 300. The diffusion barrier layer 301 may be TiN, SiTaN, or Ta.

Then, two layers of amorphous Si are deposited in a single procedure using either plasma-enhanced chemical vapor deposition (PECVD), reactive magnetron sputtering, or low pressure chemical vapor deposition (LPCVD).

First, a layer 302 of a—Si highly-doped with N dopant (e.g., phosphorous, antimony or arsenic is deposited.

Then without exposure to atmosphere a layer 303 of undoped, intrinsic a-Si is deposited in the same deposition chamber. Preferably, the thickness of layer 302 is within a range of approximately 0.01–0.05 microns, and the thickness of layer 303 preferably is within a range of approximately 0.1–0.5 microns.

Figure 3B:
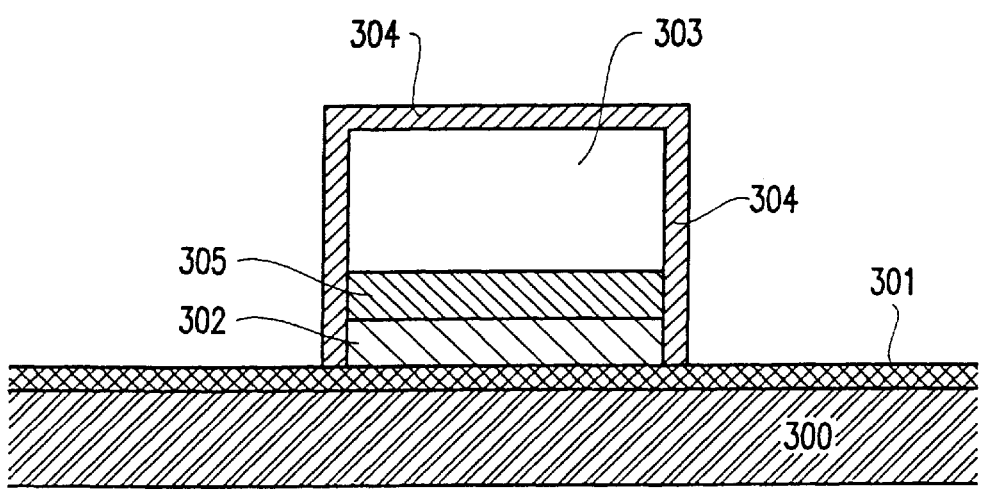

Referring to FIG. 3B, the layers 302, 303 are patterned lithographically, and etched into "mesas"(islands) using reactive ion etching (RIE). Then, the sidewalls of the mesa structure are covered with an insulator layer 304.

In an exemplary embodiment, the layer 304 is $SiO_2$, which is formed by placing the substrate in an oxidizing environment (e.g., furnace or plasma reactor containing oxygen gas) and converting the inner regions of the Si mesas into $SiO_2$.

It is noted that such a suitable time and temperature as well as characteristics of the oxidizing environment would be known by one of ordinary skill in the art taking the present specification as a whole.

In a preferred embodiment, the layer 304 is a thick deposited insulator layer which surrounds the Si mesas and fills all of the space between the Si mesas in an array of the mesas. The deposited insulator 304 is preferably $SiO_2$ or Si Nitrate deposited by plasma enhanced chemical vapor depositions, and serves to maintain the shape of the Si mesa during the annealing steps. Preferably, the layer 304 has a thickness within a range of approximately 0.01 to 0.5 microns, and more preferably in a range of 0.05 to 0.3 microns.

Then, the mesas of a-Si are converted to Poly-Si by the ELA method or the RTA method, as described above.

During this annealing step (e.g., conducted by either RTA or ELA), and during formation of the insulator 304, an N-type dopant is diffused from the contact layer 302 into the intrinsic Si layer 303, forming a lightly doped N-type semiconductor layer 305. Preferably, the layer 305 has a thickness within a range of approximately 0.01 to 0.2 microns, and more preferably in a range of 0.1 to 0.06 microns.

Figure 3C:
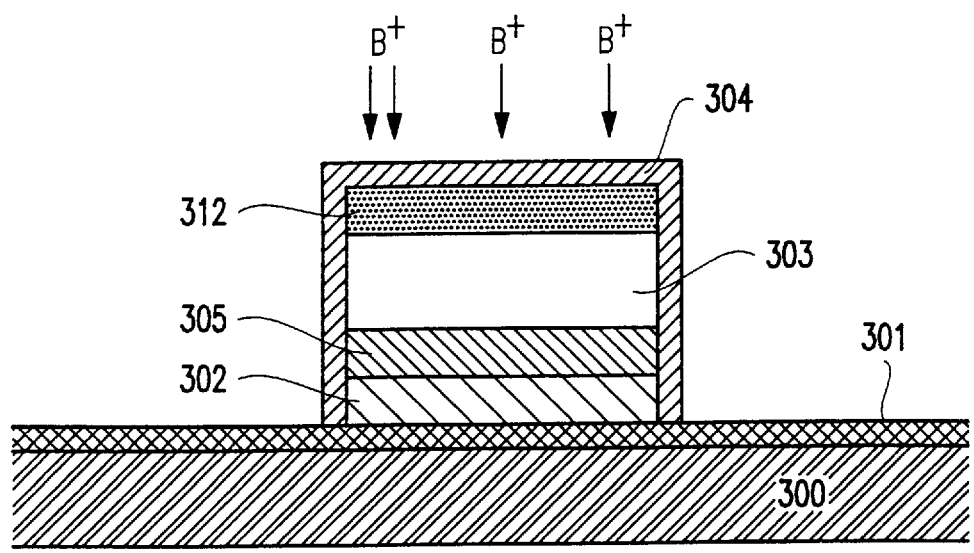

Referring to FIG. 3C, then ions of a P-type dopant (e.g., $B^+$ or $BF_{2+}$ ions) 311 are implanted into the top of the Si layer 303.

Then, the substrate is heated briefly by the ELA or RTA method (using conditions similar to the first anneal step of the first embodiment described above such as a temperature in a range between 700–900° C. and a time within the range of 10 to 1,000 seconds), to incorporate the P dopant into the Si layer, forming a layer 312 of P-doped Si having a thickness preferably within a range of approximately 0.01 to 0.1 microns, and more preferably in a range of 0.02 to 0.05 microns.

Then, after forming layer 312, the substrate is heated again briefly by the ELA or RTA method such that after heating, P dopant diffuses so that layer 321 is thicker than layer 312.

Then, the insulator layer 304 is removed (e.g., preferably by HF or buffered HF etching, or RIE) from the top surface of the diode 2, and a metal layer (e.g., unreferenced in FIG. 3C but equivalent to reference numeral 18 in FIG. 1B) is deposited. The metal layer preferably comprises tantalum, aluminum, platinum, palladium, titanium, and/or alloys of the foregoing, and preferably has a thickness within a range of 0.005 to 0.05 microns, and more preferably 0.01 to 0.02 microns.

Figure 3D:
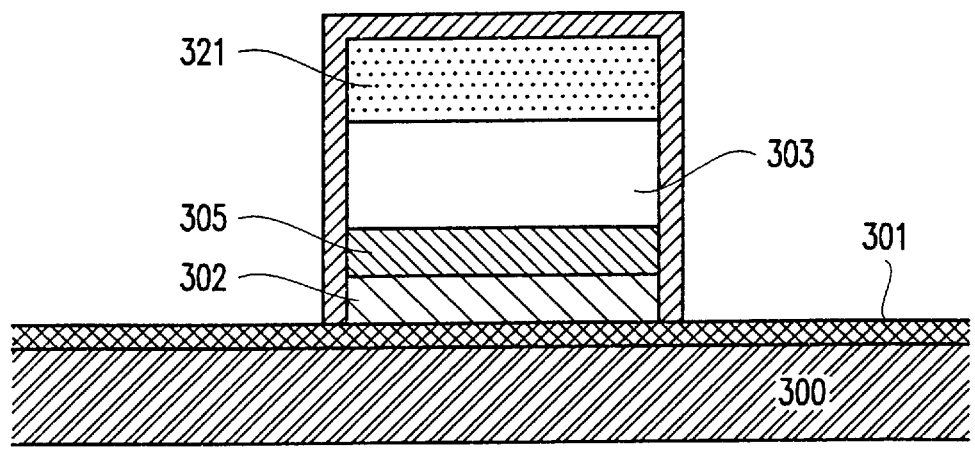
FIG. 3D illustrates the final structure of the semiconductor device (e.g., diode) according to the second embodiment of the method of the present invention.

Referring to FIG. 3D, the final structure is shown of the device made by the second embodiment of the method of the present invention.

With the second embodiment of the method of the present invention, the cost of fabrication is reduced since only one annealing step is employed, no sacrificial layer is required, and only one ion implantation step is performed.

Further, an atomically smooth top surface on the finished polycrystalline Si (Poly—Si) mesa structure is easily obtained by using amorphous Si (a—Si) layers. The atomically smooth surface is required for subsequent formation of the magnetic tunnel junction layer, so a planarization step on the finished diode is eliminated.

Additionally, the amorphous Si (a—Si) layers can be grown conformally over 3-dimensional structures. Thus, the P-N diode can be located on the sidewall of a metal addressing line (or on the sidewall of a trench). This enables high areal density arrays of diodes to be easily made.

Further, the second embodiment of the method of the present invention utilizes standard processing tools that are found in most semiconductor device factories, so that inexpensive manufacturing results.

Figure 4:
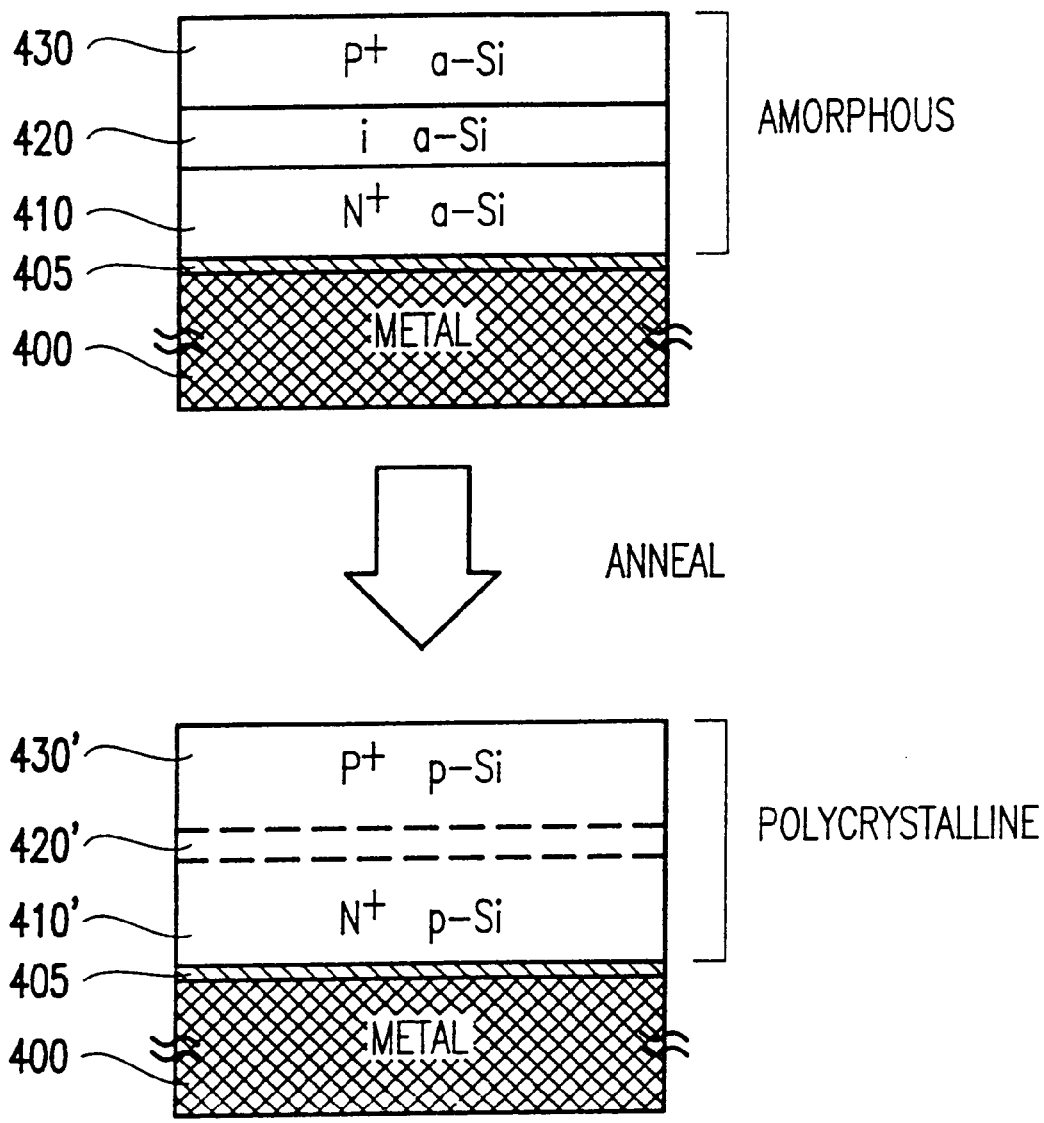
FIG. 4 illustrates a process for forming a semiconductor device (e.g., diode) according to a third embodiment of the method of the present invention.

FIG. 4 shows a third embodiment of the method of the present invention which is a simplified alternative process for making the ultra-sharp P-N junction diodes.

The third embodiment differs from the first and second embodiments by performing deposition of all layers in a single step, and by eliminating sacrificial layer and ion implantation steps.

Referring to FIG. 4, both the N and P dopants are placed in situ during a-Si deposition, in a single Si deposition step.

Optionally, a diffusion barrier layer 405 composed of TiN or SiTaN or Ta is placed on a metal line 400.

First, three layers 410, 420, and 430 are deposited in a single vacuum pumpdown (e.g., $N^+$ a—Si, intrinsic a—Si, $P^+$ a—Si) in a single deposition tool, on the metal line 400. Preferably, layer 410 has a thickness within a range of approximately 0.01 to 0.2 microns, and more preferably in a range of 0.05 to 0.1 microns. Layer 420 preferably has a thickness within a range of approximately 0.01 to 0.3 microns, and more preferably in a range of 0.01 to 0.1 microns. Layer 430 preferably has a thickness within a range of approximately 0.01 to 0.2 microns, and more preferably in a range of 0.05 to 0.1 microns.

Then, a single anneal step is performed in either an RTA tool, or an ELA tool, thereby resulting in a polycrystalline structure including $N^+$ p—Si layer 410', the P-N junction 420', and $P^+$ p—Si layer 430'. The thickness of the P-N junction 420' is preferably within the range of 0.01–0.2 microns.

For example, with a high boron concentration in layer 430, annealing for 1 minute at 850° C. results in boron diffused into layer 420 with a high boron concentration extending 0.1 microns into layer 420, and with substantial boron concentration extending 0.2 microns into layer 420. Exact concentration values depend on the boron concentration in layer 430. For annealing conditions, the thickness of layer 420 is adjusted to be about 0.2 microns.

With the third embodiment of the method of the present invention, not only are all of the advantages of the first embodiment realized, but there also are fewer steps than in previous embodiments.

With the unique and unobvious structure and method of the present invention, an ultra-sharp P-N junction diode is provided which, compared to a conventional diode, is very thin and compact and has a high forward conductance, low capacitance, and high rectification ratio.

Further, this structure is advantageous since it can be fabricated on top of metal lines or other structures that cannot tolerate high temperature processing.

Moreover, the stepwise formation method of this invention has a major advantage over ion implantation, which is formation of the P-N junction over a much smaller depth range of order 0.01–0.05 micron.

Further, slow and costly dopant implantation steps are eliminated by the use of in situ doped amorphous Si layers.

Additionally, a flat top surface on the finished p—Si mesa structure is easily obtained by using a—Si precursor layers, thereby eliminating a planarization step prior to device fabrication on top of the diode.

Finally, the a—Si layers can be grown conformally over 3-dimensional structures, thereby resulting in the P-N diode being located on the sidewall of a metal addressing line, or on the wall of a trench.

Additionally, the methods of the present invention utilize standard processing tools that are found in most semiconductor device factories, so that inexpensive manufacturing of the present invention is possible.

While the invention has been described in terms of several preferred embodiments, those skilled in the art will recognize that the invention can be practiced with modification within the spirit and scope of the appended claims.

For example, while the inventive structure and method have been described in relation to a magneto-resistive memory cell, the present invention would be beneficial to high density random access memories, and other specialized array structures including pixelated displays and light sensors.

Thus, in addition to the application in magneto-resistive memory arrays (e.g., similar to those described in U.S. Pat.

No. 5,640,343), the diode of the present invention also would be beneficial when located at each pixel element of matrix-addressed information displays and image sensors.

Further, it is noted that the conductivity types of the layers of the inventive device could be switched as would be known by one of ordinary skill in the art. Specifically, the N-type layer 14 in FIGS. 1A–1B could be provided as a P-type layer, and the P-type layer 15 could be provided as an N-type layer. Thus, a diode with a P-type layer below and an N-type layer above is also included in this invention (although this is not shown in FIGS. 1A–1B), as would be known by one of ordinary skill in the art reading the present specification.

We claim:

1. A method of producing a semiconductor device comprising an ultra-thin junction diode, comprising steps of:

depositing and patterning a metal line;

depositing on said metal line a first layer of amorphous Si, said first layer being doped with a first-type dopant and depositing on said first layer a second layer of intrinsic amorphous Si in a vacuum;

etching said first and second layers into mesa structures;

covering sidewalls of said mesa structures with an insulator layer;

converting said mesa structures to poly—Si;

implanting ions of a second-type dopant into said second layer;

heating said mesa structures to incorporate the second-type dopant into said second layer;

removing the insulator layer from a top surface of the semiconductor device; and depositing a metal layer on said top surface, wherein said poly-Si has a grain size greater than or equal to an area of said diode wherein said area of said diode is a square width of said metal line.

2. A method of producing a semiconductor device as recited in claim 1, wherein said step of etching is performed by using reactive ion etching (RIE).

3. A method of producing a semiconductor device as recited in claim 1 wherein said step of converting said mesa structures to poly—Si is performed by one of excimer laser annealing (ELA) and rapid thermal annealing (RTA).

4. A method of producing a semiconductor device as recited in claim 1, wherein a thickness of said first layer is substantially within a range of 0.1–0.5 microns, and a thickness of said second layer is substantially within a range of 0.1–0.5 microns.

5. A method of producing a semiconductor device as recited in claim 1, wherein said insulator layer covering said sidewalls of the mesa structures further surrounds the mesa structures and fills spaces between the mesa structures in an array of the mesa structures.

6. The method according to claim 1, wherein said insulator layer comprises an $SiO_2$ layer deposited by plasma enhanced chemical vapor deposition, said insulator layer maintaining a shape of said mesa structures during steps of converting and heating.

7. A method of producing a semiconductor device comprising an ultra-thin junction diode positioned between two perpendicular metal lines, comprising steps of:

depositing first, second, and third amorphous semiconductor layers, said first amorphous semiconductor layer having a first conductivity type, said second amorphous semiconductor layer comprising an intrinsic semiconductor, and said third amorphous semiconductor layer comprising a second conductivity type;

etching said first, second, and third amorphous semiconductor layers into a mesa structure;

crystalizing in a vacuum said mesa structure comprising said first, second, and third amorphous semiconductor layers to form first second and third polycrystalline semiconductor layers;

covering sidewalls of the mesa structure with an insulator layer;

removing the insulator layer from a top surface of said mesa structure; and depositing a metal layer on said top surface, wherein said first second and third polycrystalline semiconductor layers have a grain size greater than or equal to an intersecting area of said two perpendicular metal lines.

8. A method of producing a semiconductor device as recited in claim 7, wherein said step of crystallizing said semiconductor mesa is performed by one of excimer laser annealing (ELA) and rapid thermal annealing (RTA), wherein said step of etching said first, second and third amorphous semiconductor layers into said mesa structure are performed by reactive ion etching (RIE).

9. A method of producing a semiconductor device as recited in claim 7 wherein said step of depositing first, second, and third amorphous semiconductor layers is performed a single vacuum pumpdown.

10. A method of producing a semiconductor device as recited in claim 7, wherein said thickness of said second layer is selectively adjusted according to an amount of dopant diffusion resulting from said crystalizing step.

11. A method of manufacturing a semiconductor device comprising an ultra-thin junction diode positioned between two perpendicular metal lines, comprising the steps of:

depositing a sacrificial layer on a first amorphous semiconductor layer having a first conductivity-type;

performing a first annealing step in a vacuum, thereby converting the first amorphous semiconductor layer to a first polycrystalline semiconductor layer, wherein said first polycrystalline layer has a grain size greater than or equal to an intersecting area between said two perpendicular metal lines;

removing said sacrificial layer, thereby leaving an atomically smooth surface on said first polycrystalline layer;

depositing a second amorphous semiconductor layer having a second conductivity-type on said first polycrystalline layer; and performing a second annealing step in a vacuum to convert the second amorphous semiconductor layer having a second conductivity type to a second polycrystalline layer, wherein said second polycrystalline layer has a grain size greater than or equal to the intersecting area between said two perpendicular metal lines.

12. A method of manufacturing a semiconductor device as recited in claim 11, wherein the first polycrystalline semiconductor layer comprises a seed layer for the second polycrystalline semiconductor layer.

\* \* \* \* \*